(12) United States Patent
Song et al.

(10) Patent No.: US 11,462,460 B2
(45) Date of Patent: Oct. 4, 2022

(54) ELECTRICAL MODULE ASSEMBLY WITH EMBEDDED DIES

(71) Applicant: The Boeing Company, Chicago, IL (US)

(72) Inventors: Young Kyu Song, San Diego, CA (US); Kyu-Pyung Hwang, Newton, MA (US)

(73) Assignee: THE BOEING COMPANY, Chicago, IL (US)

( * ) Notice: Subject to any disclaimer, the term of this patent is extended or adjusted under 35 U.S.C. 154(b) by 52 days.

(21) Appl. No.: 16/433,099

(22) Filed: Jun. 6, 2019

(65) Prior Publication Data

US 2020/0388560 A1 Dec. 10, 2020

(51) Int. Cl.
*H01L 23/488* (2006.01)
*H01L 23/66* (2006.01)
*H01L 23/538* (2006.01)
*H01L 23/00* (2006.01)

(52) U.S. Cl.
CPC ........ *H01L 23/488* (2013.01); *H01L 23/5384* (2013.01); *H01L 23/5385* (2013.01); *H01L 23/5386* (2013.01); *H01L 23/66* (2013.01); *H01L 24/14* (2013.01); *H01L 24/94* (2013.01)

(58) Field of Classification Search
None
See application file for complete search history.

(56) References Cited

U.S. PATENT DOCUMENTS

| | | | |
|---|---|---|---|
| 2012/0063094 A1* | 3/2012 | Gaynes | H05K 3/30 361/707 |
| 2013/0009320 A1* | 1/2013 | Yoo | H01L 23/5226 257/774 |
| 2017/0033062 A1* | 2/2017 | Liu | H01L 23/528 |
| 2017/0271258 A1* | 9/2017 | Wood | H01L 29/205 |
| 2019/0131689 A1* | 5/2019 | Park | H01L 21/6835 |
| 2020/0144709 A1* | 5/2020 | Ndip | H05K 1/0243 |

* cited by examiner

*Primary Examiner* — Jay C Chang
(74) *Attorney, Agent, or Firm* — Womble Bond Dickinson (US) LLP (57) ABSTRACT

An electrical module assembly is provided. The electrical module assembly includes a circuit board with a first circuit-board surface and a second circuit-board surface defining a cavity, and an antenna disposed on the first circuit-board surface. The electrical module assembly also includes a wafer-level packaged (WLP) die embedded in the cavity. The WLP die has a first WLP die surface and a second WLP die surface. The second WLP die surface has electrical contacts thereon. The circuit board includes vias that extend from the antenna through the circuit board to the first WLP die surface to interconnect the antenna and the WLP die. The electrical module assembly further includes a second circuit board coupled to the second circuit-board surface, and coupled to the WLP die at the electrical contacts on the second WLP die surface of the WLP die.

19 Claims, 5 Drawing Sheets

ELECTRICAL MODULE ASSEMBLY WITH EMBEDDED DIES

TECHNOLOGICAL FIELD

The present disclosure relates generally to an electrical module assembly, and in particular, to an electrical module assembly with embedded dies.

BACKGROUND

Many electrical module assemblies have stacked printed circuit boards (PCBs). In such electrical module assemblies, monolithic microwave integrated circuit (MMIC) dies are often embedded in core layer of a PCB where coarse design rules and large process variations apply. In such electrical module assemblies, one defective MMIC die may cause malfunction of the whole PCB. Also, coarse design rules and large process variations lead to longer and more complicated electrical routing, which may significantly undermine electrical and thermal performance of the electrical module assemblies. Further, embedding MMIC dies in a core layer of a PCB often leads to high manufacturing cost.

Therefore, it would be desirable to have a system and method that takes into account at least some of the issues discussed above, as well as other possible issues.

BRIEF SUMMARY

Example implementations of the present disclosure are directed to an electrical module assembly with embedded dies. Example implementations of the present disclosure can package fully-tested monolithic microwave integrated circuit (MMIC) dies (e.g., known-good dies) using wafer-level packaging process to produce wafer-level packaged (WLP) dies. Example implementations of the present disclosure can form cavities on at least one-side of one or more build-up layers in a printed circuit board (PCB) of the electrical module assembly. The WLP dies can be embedded in the cavities and integrated in the PCB.

Example implementations of the present disclosure can implement its embedding process without expensive die loss because the MMIC dies are already tested before being embedded in the PCB. Relative to conventional solutions, example implementations of the present disclosure can also provide finer design rules for metal traces, thinner dielectric layers, and compact electrical routing. Example implementations of the present disclosure can further provide a higher processing speed or manufacturing throughput than conventional solutions because PCB fabrication and MIMIC fabrication may proceed almost concurrently. The overall size and weight of the electrical module assembly of example implementations can also be smaller or lower than conventional solutions.

The present disclosure thus includes, without limitation, the following example implementations.

Some example implementations provide an electrical module assembly comprising: a circuit board with opposing major surfaces including a first circuit-board surface and a second circuit-board surface, the second circuit-board surface defining a cavity in the circuit board; an antenna disposed on the first circuit-board surface of the circuit board; a wafer-level packaged (WLP) die embedded in the cavity defined by the second circuit-board surface of the circuit board, the WLP die with opposing major surfaces including a first WLP die surface and a second WLP die surface, the second WLP die surface having electrical contacts thereon, the circuit board including vias that extend from the antenna through the circuit board to the first WLP die surface to interconnect the antenna and the WLP die; and a second circuit board coupled to the second circuit-board surface, and coupled to the WLP die at the electrical contacts on the second WLP die surface of the WLP die.

In some example implementations of the electrical module assembly of any preceding example implementation, or any combination of preceding example implementations, the WLP die includes a monolithic microwave integrated circuit (MIMIC) die that is wafer-level packaged to produce the WLP die, the MMIC die being within the WLP die.

In some example implementations of the electrical module assembly of any preceding example implementation, or any combination of preceding example implementations, the WLP die includes solder bumps disposed on the first WLP die surface and in contact with the vias that extend from the antenna through the circuit board to the solder bumps on the first WLP die surface, the vias and solder bumps configured to carry signals between the antenna and the MIMIC die within the WLP die.

In some example implementations of the electrical module assembly of any preceding example implementation, or any combination of preceding example implementations, the WLP die further includes second vias that extend from the second WLP die surface to the MIMIC die within the WLP die, the second vias configured to carry signals between the MMIC die and an external communication circuit coupled to the electrical module assembly.

In some example implementations of the electrical module assembly of any preceding example implementation, or any combination of preceding example implementations, the WLP die includes solder bumps disposed on the first WLP die surface and in contact with the vias that extend from the antenna through the circuit board to the solder bumps on the first WLP die surface, and the WLP die further includes second vias that extend from the second WLP die surface to the MIMIC die within the WLP die, and the vias, the solder bumps and the second vias are configured to carry signals between the antenna, the MMIC die within the WLP die, and an external communication circuit coupled to the electrical module assembly.

In some example implementations of the electrical module assembly of any preceding example implementation, or any combination of preceding example implementations, the circuit board comprises a first build-up layer with the first circuit-board surface, a second build-up layer with the second circuit-board surface that defines the cavity in the circuit board, and a core layer between the first build-up layer and the second build-up layer.

In some example implementations of the electrical module assembly of any preceding example implementation, or any combination of preceding example implementations, the electrical contacts include thermal vias or conductive ink fill.

Some example implementations provide a method of manufacturing an electrical module assembly, the method comprising: disposing an antenna on a first circuit-board surface of a circuit board with opposing major surfaces including the first circuit-board surface and a second circuit-board surface; forming a cavity on the second circuit-board surface of the circuit board; embedding a wafer-level packaged (WLP) die in the cavity, and interconnecting the antenna and the WLP die, the WLP die with opposing major surfaces including a first WLP die surface and a second WLP die surface, the circuit board including vias that extend from the antenna through the circuit board to the first WLP die surface to interconnect the antenna and the WLP die; adding electrical contacts on the second WLP die surface; and coupling a second circuit board to the second circuit-board surface, and to the WLP die at the electrical contacts on the second WLP die surface of the WLP die.

In some example implementations of the method of any preceding example implementation, or any combination of preceding example implementations, the WLP die includes a monolithic microwave integrated circuit (MIMIC) die within the WLP die, and the method further comprises: testing the MMIC die; and thereafter, wafer-level packaging the MIMIC die to form the WLP die, the MMIC die being tested and wafer-level packaged before the WLP die is embedded in the cavity.

In some example implementations of the method of any preceding example implementation, or any combination of preceding example implementations, testing the MIMIC die includes determining that the MMIC die is a known-good die (KGD).

In some example implementations of the method of any preceding example implementation, or any combination of preceding example implementations, the method further comprises testing the WLP die to verify the wafer-level packaging of the MMIC die before the WLP die is embedded in the cavity.

In some example implementations of the method of any preceding example implementation, or any combination of preceding example implementations, the method further comprises disposing solder bumps on the first WLP die surface, the solder bumps being in contact with the vias that extend from the antenna through the circuit board to the solder bumps on the first WLP die surface, the vias and solder bumps carrying signals between the antenna and the MMIC die within the WLP die.

In some example implementations of the method of any preceding example implementation, or any combination of preceding example implementations, the circuit board comprises a first build-up layer with the first circuit-board surface, a second build-up layer with the second circuit-board surface, and a core layer between the first build-up layer and the second build-up layer, and forming the cavity includes forming the cavity in the second build-up layer.

Some example implementations provide a satellite system, comprising: an electrical module assembly comprising: a circuit board with opposing major surfaces including a first circuit-board surface and a second circuit-board surface, the second circuit-board surface defining a cavity in the circuit board; an antenna disposed on the first circuit-board surface of the circuit board; a wafer-level packaged (WLP) die embedded in the cavity defined by the second circuit-board surface of the circuit board, the WLP die with opposing major surfaces including a first WLP die surface and a second WLP die surface, the second WLP die surface having electrical contacts thereon, the circuit board including vias that extend from the antenna through the circuit board to the first WLP die surface to interconnect the antenna and the WLP die; and a second circuit board coupled to the second circuit-board surface, and coupled to the WLP die at the electrical contacts on the second WLP die surface of the WLP die; and a communication circuit coupled to the electrical module assembly and configured to transmit or receive signals via the antenna.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

DETAILED DESCRIPTION

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure are generally directed to an electrical module assembly, and in particular, to an electrical module assembly with embedded dies.

Figure 1:
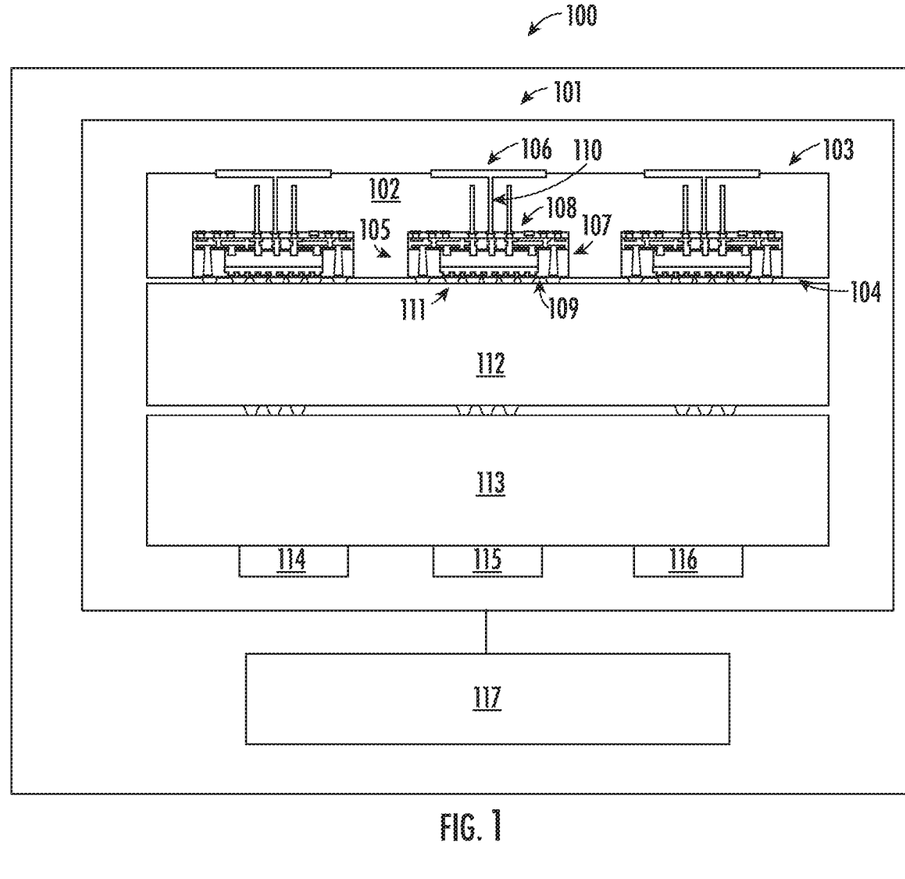
FIG. 1 illustrates a system including an electrical module assembly, according to example implementations of the present disclosure.

FIG. 1 illustrates a system 100 including an electrical module assembly 101, according to example implementations of the present disclosure. In some implementations, the system is a satellite system. In other examples, the system may be other systems such as a mainframe computer system. As shown, in some implementations, the electrical module assembly includes a circuit board 102 such as a printed circuit board (PCB). The circuit board has opposing major surfaces including a first circuit-board surface 103 and a second circuit-board surface 104.

In some implementations, the electrical module assembly 101 includes an antenna 106 disposed on the first circuit-board surface 103 of the circuit board 102. The electrical module assembly may include multiple antennas disposed on the first circuit-board surface of the circuit board, such as three antennas as shown in FIG. 1. The second circuit-board surface 104 defines a cavity 105 in the circuit board; and in some implementations, the electrical module assembly includes a wafer-level packaged (WLP) die 107 embedded in the cavity. The WLP die has opposing major surfaces including a first WLP die surface 108 and a second WLP die surface 109. In these implementations, the circuit board includes vias 110 that extend from the antenna through the circuit board to the first WLP die surface to interconnect the antenna and the WLP die.

In some implementations, the second WLP die surface 109 has electrical contacts 111 thereon. Examples of suitable electrical contacts include thermal vias or conductive ink fill.

The electrical module assembly 101 also includes a second circuit board 112 coupled to the second circuit-board surface 104, and coupled to the WLP die 107 at the electrical contacts 111 on the second WLP die surface 109 of the WLP die. The second circuit board may be a routing PCB.

The electrical module assembly 101 may further include a third circuit board 113 such as a digital PCB coupled to the second circuit board 112. Additionally, the electrical module assembly may include circuitry such as a filter 114, a signal or power source 115 and/or an application-specific integrated circuit (ASIC) 116. In some implementations, the system 100 also includes a communication circuit 117 coupled to the electrical module assembly and configured to transmit or receive signals via the antenna 106.

Figure 2:
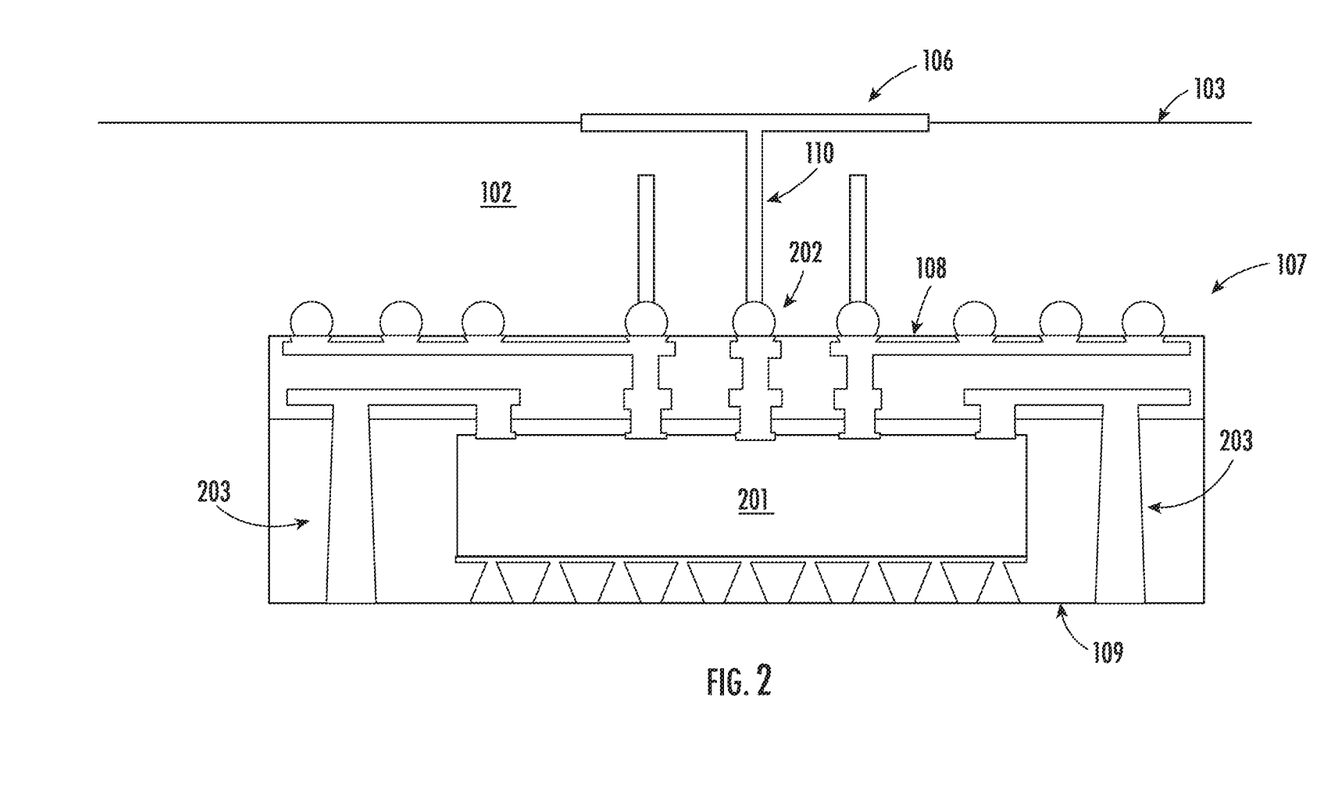
FIG. 2 illustrates a wafer-level packaged die, according to example implementations of the present disclosure.

FIG. 2 illustrates the WLP die 107, according to example implementations of the present disclosure. As shown, in some implementations, the WLP die includes a monolithic microwave integrated circuit (MMIC) die 201 that is wafer-level packaged to produce the WLP die. The MMIC die is within the WLP die. In some implementations, the WLP die includes solder bumps 202 disposed on the first WLP die surface 108. The solder bumps are in contact with the vias 110 that extend from the antenna 106 through the circuit board 102 to the solder bumps on the first WLP die surface. The vias and solder bumps are configured to carry signals between the antenna and the MMIC die within the WLP die.

In some implementations, the WLP die 107 includes second vias 203 that extend from the second WLP die surface 109 to the MMIC die 201 within the WLP die. The second vias are configured to carry signals between the MMIC die and the communication circuit 117 coupled to the electrical module assembly 101. In these implementations, the communication circuit is external to the electrical module assembly. In some implementations, the vias 110, the solder bumps 202 and the second vias are configured to carry signals between the antenna 106, the MMIC die within the WLP die, and the external communication circuit coupled to the electrical module assembly.

Figure 3:
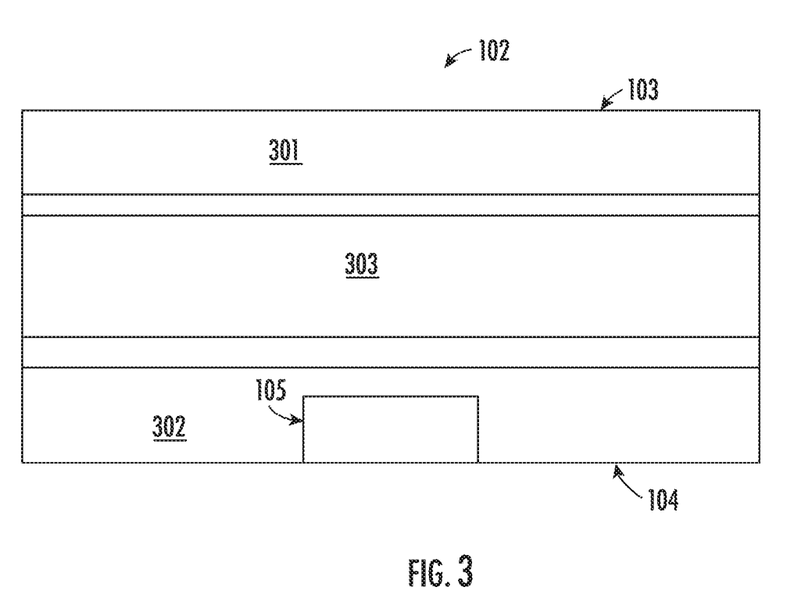
FIG. 3 illustrates a circuit board with different layers, according to example implementations of the present disclosure.

FIG. 3 illustrates the circuit board 102 with different layers, according to example implementations of the present disclosure. As shown, in some implementations, the circuit board includes a first build-up layer 301 with the first circuit-board surface 103, a second build-up layer 302 with the second circuit-board surface 104 that defines the cavity 105 in the circuit board, and a core layer 303 between the first build-up layer and the second build-up layer. In these implementations, the cavity is formed in the second build-up layer, not in the core layer. In other implementations, the cavity may be formed in the first build-up layer as well. The first build-up layer, second build-up layer, and core layer may be copper layers. Thickness of the first build-up layer or second build-up layer may be less than 150 micrometers, and thickness of the core layer may be more than 300 micrometers.

Figure 4:
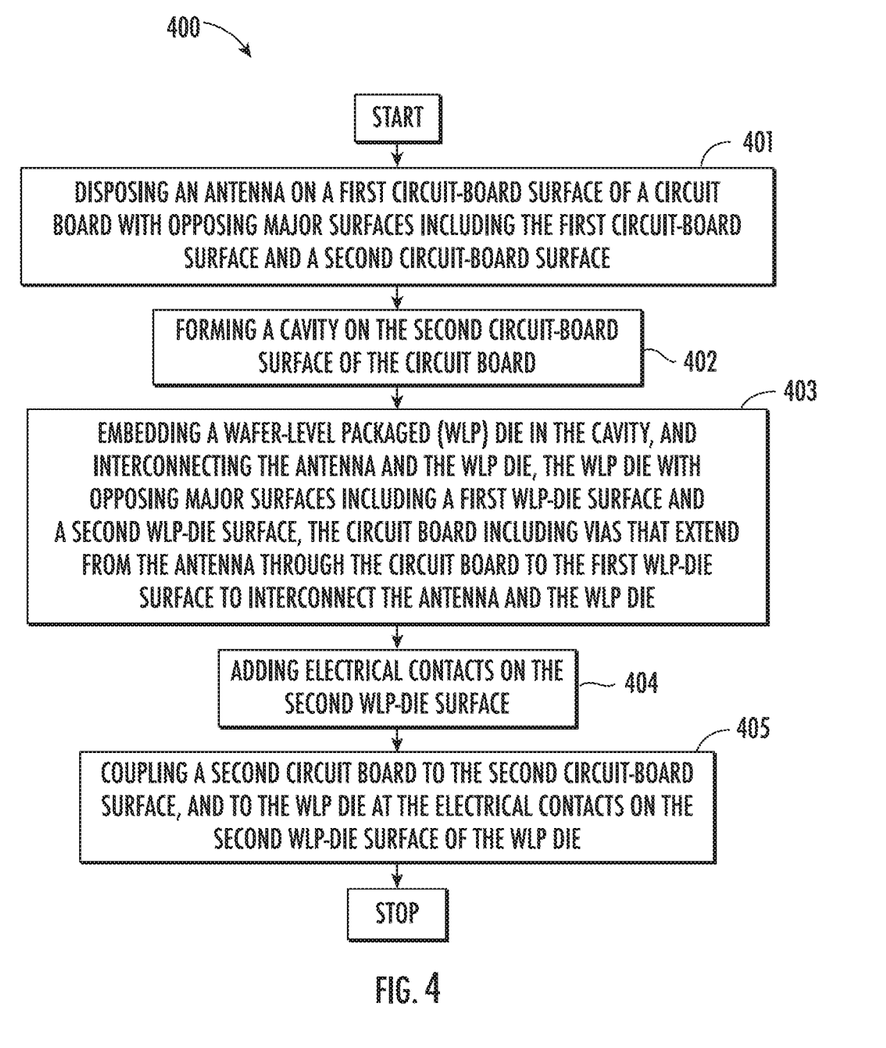
FIG. 4 illustrates a flowchart of various operations in a method of manufacturing an electrical module assembly, according to example implementations of the present disclosure.

FIG. 4 illustrates a flowchart of various operations in a method 400 of manufacturing the electrical module assembly 101, according to example implementations of the present disclosure. As shown, in some implementations, at block 401, the method includes disposing an antenna 106 on a first circuit-board surface 103 of a circuit board 102 with opposing major surfaces including the first circuit-board surface and a second circuit-board surface 104. At block 402, the method includes forming a cavity 105 on the second circuit-board surface of the circuit board. In some implementations, the circuit board includes a first build-up layer 301 with the first circuit-board surface, a second build-up layer 302 with the second circuit-board surface, and a core layer 303 between the first build-up layer and the second build-up layer. In these implementations, forming the cavity includes forming the cavity in the second build-up layer.

In some implementations, at block 403, the method 400 includes embedding a wafer-level packaged (WLP) die 107 in the cavity 105, and interconnecting the antenna 106 and the WLP die. The WLP die has opposing major surfaces including a first WLP die surface 108 and a second WLP die surface 109. The circuit board 102 includes vias 110 that extend from the antenna through the circuit board to the first WLP die surface to interconnect the antenna and the WLP die.

In some implementations, the WLP die 107 includes a MMIC die 201 within the WLP die. In these implementations, the method 400 further comprises: testing the MMIC die; and thereafter, wafer-level packaging the MMIC die to form the WLP die. The MMIC die is tested and wafer-level packaged before the WLP die is embedded in the cavity 105. In these implementations, testing the MMIC die includes determining that the MMIC die is a known-good die (KGD). In some implementations, the method further comprises testing the WLP die to verify the wafer-level packaging of the MMIC die before the WLP die is embedded in the cavity. In these implementations, the WLP die may be tested to verify that the wafer-level packaging procedure is properly performed.

In some implementations, the method 400 further comprises disposing solder bumps 202 on the first WLP die surface 108. The solder bumps are in contact with the vias 110 that extend from the antenna 106 through the circuit board 102 to the solder bumps on the first WLP die surface. The vias and solder bumps carry signals between the antenna and the MMIC die 201 within the WLP die 107.

In some implementations, at block 404, the method 400 includes adding electrical contacts 111 on the second WLP die surface 109. At block 405, the method includes coupling a second circuit board 112 to the second circuit-board surface, and to the WLP die 107 at the electrical contacts on the second WLP die surface of the WLP die.

Figure 5:
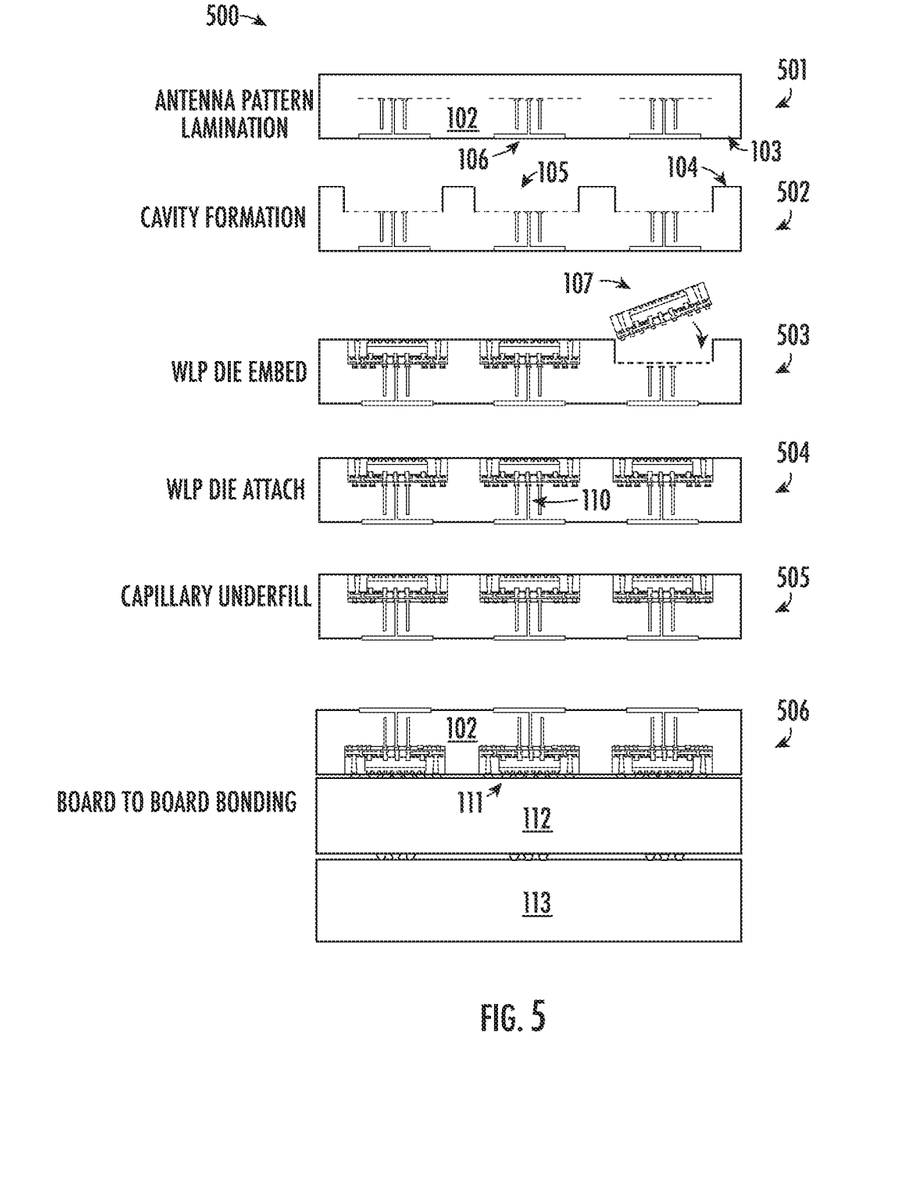
FIG. 5 illustrates a diagram of manufacturing an electrical module assembly, according to example implementations of the present disclosure.

FIG. 5 illustrates a diagram 500 of manufacturing the electrical module assembly 101, according to example implementations of the present disclosure. As shown, in some implementations, in order to dispose the antenna 106 on the first circuit-board surface 103 of the circuit board 102 as described at block 401 above, antenna pattern lamination can be performed, as indicated by arrow 501. Cavity formation can be performed to form one or more cavities 105 on the second circuit-board surface 104 of the circuit board, as indicated by arrow 502, which may correspond to block 402 described above.

After the cavities 105 are formed, the WLP dies 107 can be embedded in the formed cavities 105, as indicated by arrow 503. The WLP dies can be attached to the circuit board 102 to interconnect the antenna 106 and the WLP dies through the vias 110, as indicated by arrow 504. The processes indicated by arrows 503 and 504 may correspond to block 403 described above. Capillary underfill can be performed as indicated by arrow 505. Board to board bonding can be performed to add electrical contacts 111 on the second WLP die surface 109 and bond the circuit board 102 with the second circuit board 112 at the electrical contacts, as indicated by arrow 506, which may correspond to blocks 404 and 405 described above.

Many modifications and other implementations of the disclosure set forth herein will come to mind to one skilled in the art to which the disclosure pertains having the benefit of the teachings presented in the foregoing description and the associated figures. Therefore, it is to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An electrical module assembly comprising:
  a circuit board with opposing major surfaces including a first circuit-board surface and a second circuit-board surface, the second circuit-board surface defining a cavity in the circuit board;
  an antenna radiator disposed directly on the first circuit-board surface of the circuit board such that there is no gap between the antenna radiator and the first circuit board surface of the circuit board;
  a wafer-level packaged die embedded in the cavity defined by the second circuit-board surface of the circuit board, the wafer-level packaged die with opposing major surfaces including a first wafer-level packaged die surface and a second wafer-level packaged die surface, the second wafer-level packaged die surface having electrical contacts thereon, the circuit board including vias that extend from the antenna radiator through the circuit board to the first wafer-level packaged die surface to interconnect the antenna radiator and the wafer-level packaged die; and
  a second circuit board coupled to the second circuit-board surface, and coupled to the wafer-level packaged die at the electrical contacts on the second wafer-level packaged die surface of the wafer-level packaged die,
  wherein the wafer-level packaged die includes a monolithic microwave integrated circuit die that is wafer-level packaged to produce the wafer-level packaged die, the monolithic microwave integrated circuit die being within the wafer-level packaged die, and
  wherein the wafer-level packaged die includes solder bumps disposed on the first wafer-level packaged die surface and in contact with the vias that extend from the antenna radiator through the circuit board to the solder bumps on the first wafer-level packaged die surface, the vias and solder bumps configured to carry signals between the antenna radiator and the monolithic microwave integrated circuit die within the wafer-level packaged die.

2. The electrical module assembly of claim 1, wherein the wafer-level packaged die further includes second vias that extend from the second wafer-level packaged die surface to the monolithic microwave integrated circuit die within the wafer-level packaged die, the second vias configured to carry signals between the monolithic microwave integrated circuit die and an external communication circuit coupled to the electrical module assembly.

3. The electrical module assembly of claim 1, wherein the wafer-level packaged die further includes second vias that extend from the second wafer-level packaged die surface to the monolithic microwave integrated circuit die within the wafer-level packaged die.

4. The electrical module assembly of claim 3, wherein the vias, the solder bumps and the second vias are configured to carry signals between the antenna radiator, the monolithic microwave integrated circuit die within the wafer-level packaged die, and an external communication circuit coupled to the electrical module assembly.

5. The electrical module assembly of claim 1, wherein the circuit board comprises a first build-up layer with the first circuit-board surface, a second build-up layer with the second circuit-board surface that defines the cavity in the circuit board, and a core layer between the first build-up layer and the second build-up layer.

6. The electrical module assembly of claim 1, wherein the electrical contacts include thermal vias or conductive ink fill.

7. The electrical module assembly of claim 1, wherein the electrical contacts include conductive ink fill.

8. A method of manufacturing an electrical module assembly, the method comprising:
  disposing an antenna radiator directly on a first circuit-board surface of a circuit board with opposing major surfaces including the first circuit-board surface and a second circuit-board surface, the antenna radiator being disposed such that there is no gap between the antenna radiator and the first circuit board surface of the circuit board;
  forming a cavity in the second circuit-board surface of the circuit board such that the second circuit-board surface defines the cavity in the circuit board;
  embedding a wafer-level packaged die in the cavity, and interconnecting the antenna radiator and the wafer-level packaged die, the wafer-level packaged die with opposing major surfaces including a first wafer-level packaged die surface and a second wafer-level packaged die surface, the circuit board including vias that extend from the antenna radiator through the circuit board to the first wafer-level packaged die surface to interconnect the antenna radiator and the wafer-level packaged die;

adding electrical contacts on the second wafer-level packaged die surface; and coupling a second circuit board to the second circuit-board surface, and to the wafer-level packaged die at the electrical contacts on the second wafer-level packaged die surface of the wafer-level packaged die, wherein the wafer-level packaged die includes a monolithic microwave integrated circuit die that is wafer-level packaged to form the wafer-level packaged die, the monolithic microwave integrated circuit die being within the wafer-level packaged die, and the method further comprising disposing solder bumps on the first wafer-level packaged die surface, the solder bumps being in contact with the vias that extend from the antenna radiator through the circuit board to the solder bumps on the first wafer-level packaged die surface, the vias and solder bumps carrying signals between the antenna radiator and the monolithic microwave integrated circuit die within the wafer-level packaged die.

9. The method of claim 8, wherein the method further comprises:
testing the monolithic microwave integrated circuit die; and thereafter,
wafer-level packaging the monolithic microwave integrated circuit die to form the wafer-level packaged die, the monolithic microwave integrated circuit die being tested and wafer-level packaged before the wafer-level packaged die is embedded in the cavity.

10. The method of claim 9, wherein testing the monolithic microwave integrated circuit die includes determining that the monolithic microwave integrated circuit die is a known-good die.

11. The method of claim 9, further comprising testing the wafer-level packaged die to verify the wafer-level packaging of the monolithic microwave integrated circuit die before the wafer-level packaged die is embedded in the cavity.

12. The method of claim 8, wherein the circuit board comprises a first build-up layer with the first circuit-board surface, a second build-up layer with the second circuit-board surface, and a core layer between the first build-up layer and the second build-up layer, and wherein forming the cavity includes forming the cavity in the second build-up layer.

13. A satellite system, comprising:
an electrical module assembly comprising:
a circuit board with opposing major surfaces including a first circuit-board surface and a second circuit-board surface, the second circuit-board surface defining a cavity in the circuit board;
an antenna radiator disposed directly on the first circuit-board surface of the circuit board such that there is no gap between the antenna radiator and the first circuit board surface of the circuit board;
a wafer-level packaged die embedded in the cavity defined by the second circuit-board surface of the circuit board, the wafer-level packaged die with opposing major surfaces including a first wafer-level packaged die surface and a second wafer-level packaged die surface, the second wafer-level packaged die surface having electrical contacts thereon, the circuit board including vias that extend from the antenna radiator through the circuit board to the first wafer-level packaged die surface to interconnect the antenna radiator and the wafer-level packaged die; and
a second circuit board coupled to the second circuit-board surface, and coupled to the wafer-level packaged die at the electrical contacts on the second wafer-level packaged die surface of the wafer-level packaged die; and a communication circuit coupled to the electrical module assembly and configured to transmit or receive signals via the antenna radiator,
wherein the wafer-level packaged die includes a monolithic microwave integrated circuit die that is wafer-level packaged to produce the wafer-level packaged die, the monolithic microwave integrated circuit die being within the wafer-level packaged die, and
wherein the wafer-level packaged die includes solder bumps disposed on the first wafer-level packaged die surface and in contact with the vias that extend from the antenna radiator through the circuit board to the solder bumps on the first wafer-level packaged die surface, the vias and solder bumps configured to carry signals between the antenna radiator and the monolithic microwave integrated circuit die within the wafer-level packaged die.

14. The satellite system of claim 13, wherein the wafer-level packaged die further includes second vias that extend from the second wafer-level packaged die surface to the monolithic microwave integrated circuit die within the wafer-level packaged die, the second vias configured to carry signals between the monolithic microwave integrated circuit die and an external communication circuit coupled to the electrical module assembly.

15. The satellite system of claim 13, wherein the wafer-level packaged die further includes second vias that extend from the second wafer-level packaged die surface to the monolithic microwave integrated circuit die within the wafer-level packaged die.

16. The satellite system of claim 15, wherein the vias, the solder bumps and the second vias are configured to carry signals between the antenna radiator, the monolithic microwave integrated circuit die within the wafer-level packaged die, and an external communication circuit coupled to the electrical module assembly.

17. The satellite system of claim 13, wherein the circuit board comprises a first build-up layer with the first circuit-board surface, a second build-up layer with the second circuit-board surface that defines the cavity in the circuit board, and a core layer between the first build-up layer and the second build-up layer.

18. The satellite system of claim 13, wherein the electrical contacts include thermal vias.

19. The satellite system of claim 13, wherein the electrical contacts include conductive ink fill.

* * * * *

UNITED STATES PATENT AND TRADEMARK OFFICE
CERTIFICATE OF CORRECTION

PATENT NO. : 11,462,460 B2
APPLICATION NO. : 16/433099
DATED : October 4, 2022
INVENTOR(S) : Young Kyu Song et al.

It is certified that error appears in the above-identified patent and that said Letters Patent is hereby corrected as shown below:

In the Claims

In Column 8, Claim 6, Line 47, "include thermal vias or conductive ink fill." should read -- include thermal vias. --

Signed and Sealed this
Twenty-ninth Day of November, 2022

Katherine Kelly Vidal
*Director of the United States Patent and Trademark Office*